United States Patent
Hyun et al.

(10) Patent No.: US 8,044,680 B2
(45) Date of Patent: Oct. 25, 2011

(54) SEMICONDUCTOR MEMORY DEVICE AND ON-DIE TERMINATION CIRCUIT

(75) Inventors: Dong-Ho Hyun, Gyeonggi-do (KR); Jin-Sung Kim, Gyeonggi-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 12/469,446

(22) Filed: May 20, 2009

(65) Prior Publication Data

US 2009/0309628 A1 Dec. 17, 2009

(30) Foreign Application Priority Data

Jun. 17, 2008 (KR) .................. 10-2008-0056774

(51) Int. Cl.
*H03K 17/16* (2006.01)
(52) U.S. Cl. .......................................... 326/30
(58) Field of Classification Search .............. 326/30, 326/82–87
See application file for complete search history.

(56) References Cited

U.S. PATENT DOCUMENTS

| | | | |
|---|---|---|---|
| 7,164,611 B2 * | 1/2007 | Kinsley | .......... 365/195 |
| 2006/0255830 A1 | 11/2006 | Kim | |
| 2007/0222476 A1 | 9/2007 | Lee | |
| 2008/0315913 A1 * | 12/2008 | Kim | ............ 326/30 |

FOREIGN PATENT DOCUMENTS

| | | |
|---|---|---|
| JP | 2007-257822 | 10/2007 |
| KR | 2003-0083237 | 10/2003 |
| KR | 2003-0090955 | 12/2003 |
| KR | 2004-0055879 | 6/2004 |
| KR | 2007-0036552 | 4/2007 |
| KR | 2007-0096214 | 10/2007 |
| KR | 10-0780962 | 11/2007 |

* cited by examiner

*Primary Examiner* — Shawki Ismail
*Assistant Examiner* — Thienvu Tran
(74) *Attorney, Agent, or Firm* — Volentine & Whitt, PLLC

(57) ABSTRACT

An on-die termination (ODT) circuit including drive signal generators, each drive signal generator configured to generate a corresponding plurality of ODT drive signals; and ODT drive units, each ODT drive unit configured to terminate a corresponding terminal with a termination resistance in response to the ODT drive signals of a corresponding drive signal generator. The drive signal generators are configured to supply the ODT drive signals to the ODT drive units to output a plurality of ODT control signals through the terminals in a test mode.

11 Claims, 6 Drawing Sheets

SEMICONDUCTOR MEMORY DEVICE AND ON-DIE TERMINATION CIRCUIT

CROSS-REFERENCE TO RELATED APPLICATION

This application claims the benefit of Korean Patent Application No. 10-2008-0056774, filed Jun. 17, 2008, the contents of which are hereby incorporated herein by reference in their entirety.

BACKGROUND

This disclosure relates to a semiconductor memory device, and more particularly, to a semiconductor memory device having an on-die termination circuit capable of outputting an ODT control signal.

Semiconductor memory devices exchange data signals with a memory controller. Termination resistance can be used to improve signal integrity by minimizing signal reflections. When such a termination resistance is inside a semiconductor memory device, it can be referred to as an ODT resistance. A circuit which includes and controls the ODT resistance can be referred to as an ODT circuit.

Since the termination resistance for optimizing signal integrity can differ between operations, a dynamic ODT mode can be used. The semiconductor memory device can be configured to allow a user to select various termination resistances in each of a normal ODT mode and a dynamic ODT mode.

SUMMARY

An embodiment includes an on-die termination (ODT) circuit including drive signal generators, each drive signal generator configured to generate a corresponding plurality of ODT drive signals; and ODT drive units, each ODT drive unit configured to terminate a corresponding terminal with a termination resistance in response to the ODT drive signals of a corresponding drive signal generator. The drive signal generators are configured to supply the ODT drive signals to the ODT drive units to output a plurality of ODT control signals through the terminals in a test mode.

Another embodiment includes a semiconductor memory device including a command decoder configured to output a normal ODT enable signal and a dynamic ODT enable signal; a control signal generator configured to output a plurality of ODT control signals in response to the normal ODT enable signal and the dynamic ODT enable signal, and activate an ODT check signal during an ODT test mode operation; drive signal generators, each drive signal generator configured to generate a corresponding plurality of ODT drive signals in response to the ODT control signals, the normal ODT enable signal, the dynamic ODT enable signal, and the ODT check signal; ODT drive units, each ODT drive unit configured to terminate a corresponding terminal with a termination resistance in response to the ODT drive signals of a corresponding drive signal generator. The drive signal generators are configured to supply the ODT drive signals to the ODT drive units to output the ODT control signals through the terminals in a test mode.

Another embodiment includes a method of outputting on-die termination (ODT) signals from a semiconductor device including enabling a test mode; outputting the ODT signals through a plurality of terminals of the semiconductor device for inputting and outputting data. The ODT signals are output substantially simultaneously through the terminals.

DETAILED DESCRIPTION

Embodiments will be described with reference to the accompanying drawings.

Figure 1:
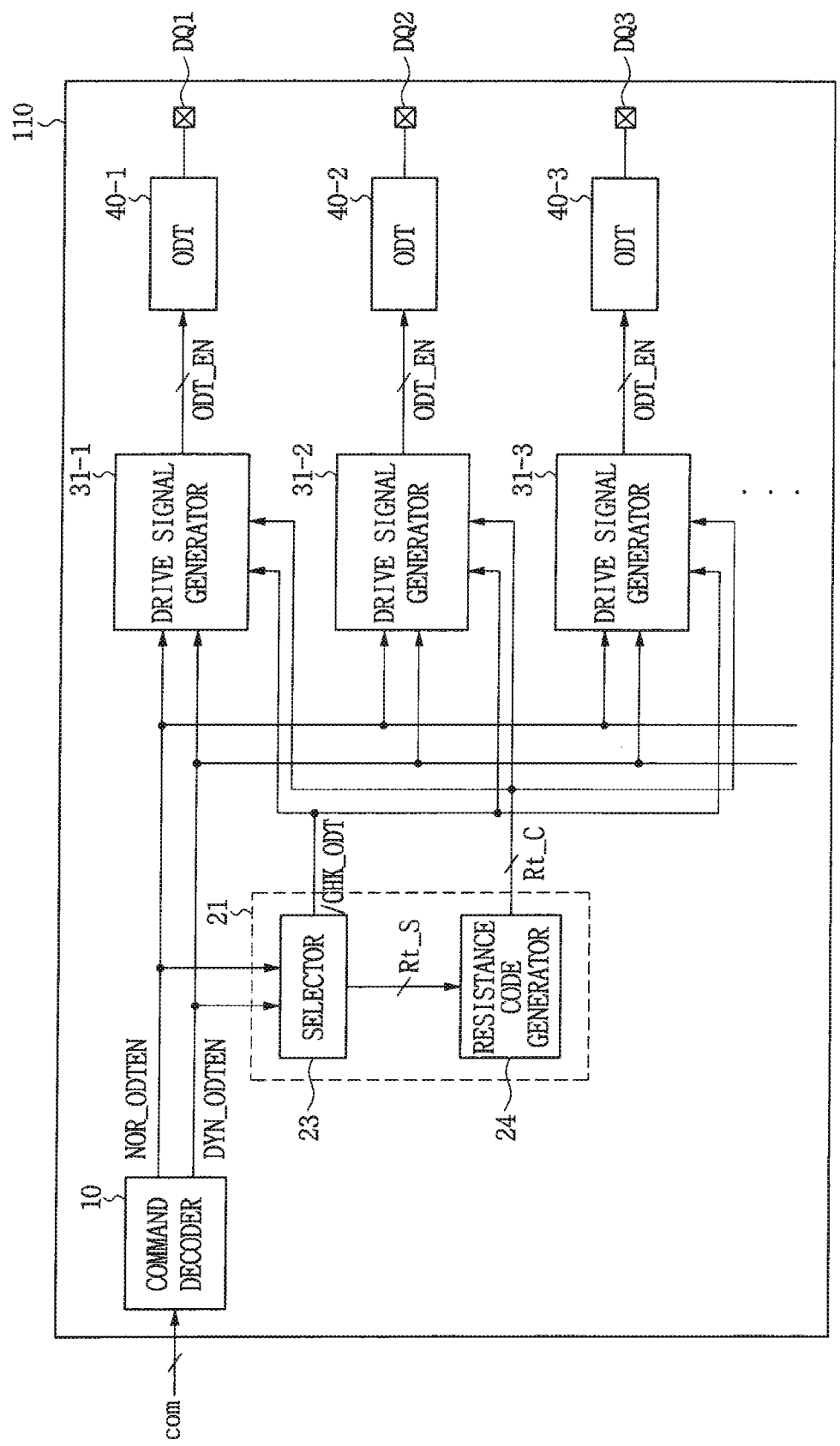
FIG. 1 is a block diagram illustrating a configuration of a semiconductor memory device according to an embodiment.

FIG. 1 is a block diagram illustrating a configuration of a semiconductor memory device according to an embodiment. In this embodiment, the semiconductor memory device 110 includes a command decoder 10, a control signal generator 21, multiple drive signal generators 31-1, 31-2, 31-3, etc., and multiple ODT drive units 40-1, 40-2, 40-3, etc. The ODT drive units 40-1, 40-2, 40-3, etc. are configured to terminate terminals DQ1, DQ2, DQ3, etc. with predetermined termination voltages and termination resistances in response to ODT drive signals ODT_EN output from the drive signal generators 31-1, 31-2, 31-3, etc.

Although the ODT drive signals ODT_EN output from different drive signal generators 31-1, 31-2, and 31-3 are labeled the same, such signals, while all being ODT drive signals, need not be the same signals in operation. That is, each drive signal generator can be configured to generate a different set of signals for the corresponding ODT drive signals ODT_EN. Thus, each ODT drive unit 40 can be provided with similar signals, different signals, or the like. As used herein, drive signal generators may be referred to in common as drive signal generators 31 or drive signal generators 31-x, where x designates a particular drive signal generator 31. A similar designation may be used for ODT drive units 40, or the like.

The command decoder 10 is configured to receive a command com. In an embodiment, the command com can be a command applied external to the semiconductor memory device 110. For example, the command com can be applied by a memory controller (not shown). However, in another embodiment, the command com can be generated internal to the semiconductor memory device 110.

The command decoder 10 is configured to activate a normal ODT enable signal NOR_ODTEN or a dynamic ODT enable signal DYN_ODTEN in response to the command com. For example, the command com may include an ODT signal, a write command, a read command, or the like. The command decoder 10 can be configured to activate the normal ODT enable signal NOR_ODTEN in response to the ODT signal during a normal operation, activate the dynamic ODT enable signal DYN_ODTEN in response to the write command during a write operation, and deactivate both the normal ODT enable signal NOR_ODTEN and the dynamic ODT enable signal DYN_ODTEN in response to the read command during a read operation. However, in an embodiment the activation of the normal ODT enable signal NOR_ODTEN, the dynamic ODT enable signal DYN_ODTEN, or the like, can be associated with different commands.

The control signal generator 21 includes a selector 23 and a resistance code generator 24. The control signal generator 21 is configured to output ODT control signals Rt_C in response to a normal ODT enable signal NOR_ODTEN and/or a dynamic ODT enable signal DYN_ODTEN output from the command decoder 10, and activate an ODT check signal/CHK_ODT during an ODT test mode operation. The selector 23 is configured to output resistance selection signals Rt_S in response to the normal ODT enable signal NOR_ODTEN and the dynamic ODT enable signal DYN_ODTEN output from the command decoder 10, and activate the ODT check signal /CHK_ODT during the ODT test mode operation. In an embodiment, the selector 23 can include a mode register set, or the like. The resistance code generator 24 is configured to output ODT control signals Rt_C in response to the resistance selection signals Rt_S output from the selector 23. Although the control signal generator 21 has been described as including the selector 23 and the resistance code generator 24, the control signal generator 21 may include only the selector 23 configured with the mode register set, or the like.

During a normal mode operation (for example, the normal operation can include the write operation and the read operation), the drive signal generators 31 can be configured to output the ODT drive signals ODT_EN in response to the normal ODT enable signal NOR_ODTEN and/or the dynamic ODT enable signal DYN_ODTEN output from the command decoder 10 and the ODT control signals Rt_C and the ODT check signal /CHK_ODT output from the control signal generator 21. In an embodiment, in the normal mode, the ODT drive signals ODT_EN can be substantially the same for each ODT drive unit 40 during a particular operation. For example, in a write operation, all of the ODT drive signals ODT_EN can be generated by the corresponding drive signal generators to be substantially similar. In a read operation, the drive signal generators can again generate the ODT drive signals ODT_EN to be substantially similar, while being different from the ODT drive signals ODT_EN used in the write operation.

During the ODT test mode operation, the drive signal generators 31 are configured to select and output one of the ODT control signals Rt_C as one of the ODT drive signals ODT_EN in response to the normal ODT enable signal NOR_ODTEN and the dynamic ODT enable signal DYN_ODTEN output from the command decoder 10 and the ODT control signals Rt_C and the ODT check signal/CHK_ODT output from the control signal generator 21.

In particular, in the ODT test mode, the ODT drive signals ODT_EN can be different among different drive signal generators 31. For example, the ODT drive signals ODT_EN generated by the drive signal generator 31-1 can be different from the ODT drive signals ODT_EN generated by the drive signal generator 31-2. Thus, the ODT drive units 40 can be driven differently. In particular, in an embodiment, the ODT control signals Rt_C can be output by controlling the ODT drive signals ODT_EN such that the ODT drive units 40 cause each bit of the ODT control signals Rt_C to be output on corresponding terminals DQ.

Although only three drive signal generators 31, ODT drive units 40, or the like have been illustrated in FIG. 1, any number of such circuits can be used. For example, an input/output (I/O) port of the semiconductor memory device 110 could have 16 terminals DQ. Accordingly, there can be 16 drive signal generators 31, 16 ODT drive units 40, and the like. In addition, although a drive signal generator 31 has been illustrated on a one-to-one basis with an ODT drive unit 40, in an embodiment, ODT drive units 40 can have different types of drive signal generators. For example, if the ODT control signals Rt_C include 6 bits while there are 16 terminals DQ, 6 ODT drive units 40 can have corresponding drive signal generators 31 while the other 10 ODT drive units 40 can have different types of drive signal generators. For example, the different types of drive signal generators may not be responsive to the ODT check signal/CHK_ODT.

Figure 2:
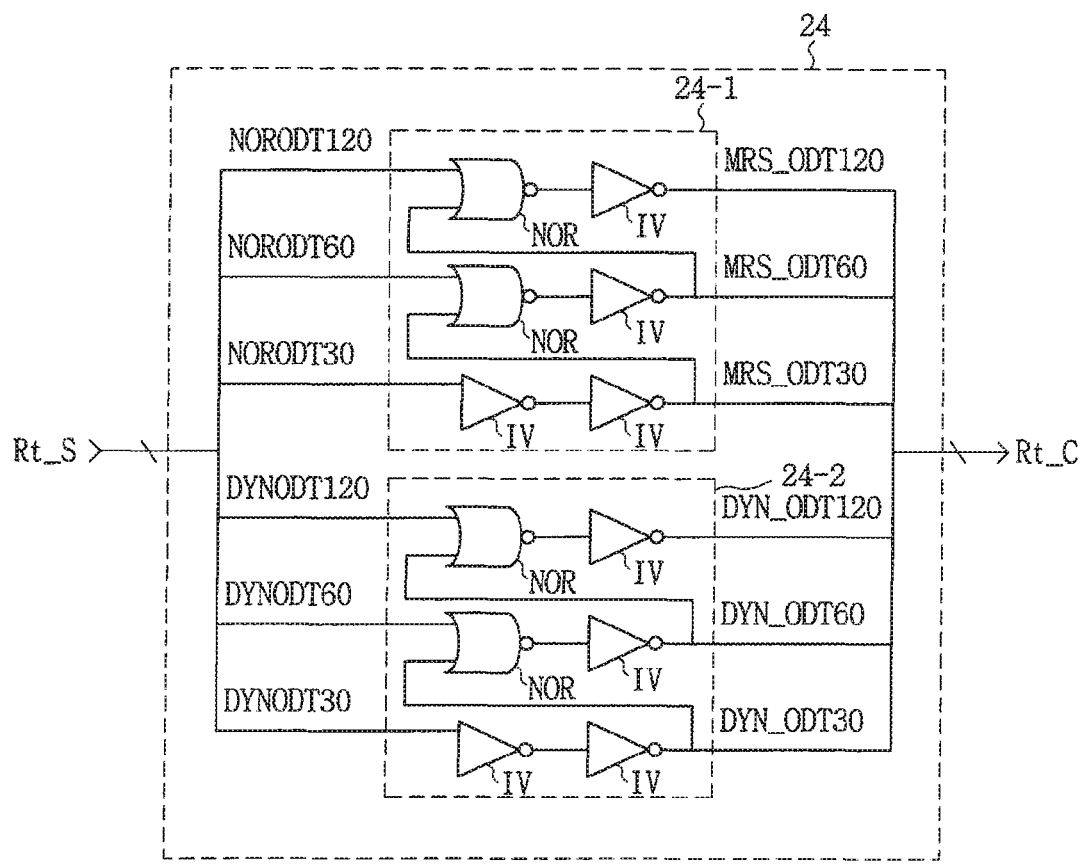
FIG. 2 is a schematic diagram illustrating an example of a resistance code generator of a control signal generator of the semiconductor memory device of FIG. 1.

FIG. 2 is a schematic diagram illustrating an example of a resistance code generator of a control signal generator of the semiconductor memory device of FIG. 1. The resistance code generator 24 includes a normal resistance code generator 24-1 and a dynamic resistance code generator 24-2.

The normal resistance code generator 24-1 includes NOR gates (NOR) and inverters (IV). The normal resistance code generator 24-1 is configured to output normal resistance code signals MRS_ODT30, MRS_ODT60, and MRS_ODT120 in response to normal resistance selection signals NORODT30, NORODT60, and NORODT120 of the resistance selection signals Rt_S output from the selector 23. The dynamic resistance code generator 24-2 includes NOR gates (NOR) and inverters (IV). The dynamic resistance code generator 24-2 is configured to output dynamic resistance code signals DYN_ODT30, DYN_ODT60, and DYN_ODT120 in response to dynamic resistance selection signals DYNODT30, DYNODT60, and DYNODT120 of the resistance selection signals Rt_S output from the selector 23. In this embodiment, the designation of the resistance code signals, resistance selection signals, or the like can indicate a corresponding termination resistance. For example, MRS_ODT30, MRS_ODT60, and MRS_ODT120 can correspond to resistances of approximately 30 ohms, 60 ohms, and 120 ohms, respectively. However, the termination resistances are not limited to 30 ohms, 60 ohms, 120 ohms, multiples of 30 ohms, or the like. That is, the termination resistances can be any resistances as desired. Moreover, the various signals need not refer to any particular individual termination resistance or a particular resistance that can be used in creating a termination resistance. Such resistances and the implicit reference to the resistances are only for illustration.

The resistance selection signals Rt_S output from the selector 23 can include the normal resistance selection signals NORODT30, NORODT60, and NORODT120 and the dynamic resistance selection signals DYNODT30, DYNODT60, and DYNODT120. The ODT control signals Rt_C output from the resistance code generator 24 can include the normal resistance code signals MRS_ODT30, MRS_ODT60, and MRS_ODT120 and the dynamic resistance code signals DYN_ODT30, DYN_ODT60, and DYN_ODT120.

In an embodiment, the selector 23 of FIG. 1 is configured to output one of the normal resistance selection signals NORODT30, NORODT60, and NORODT120 as "1" in response to the normal ODT enable signal NOR_ODTEN output from the command decoder 10, and outputs one of the dynamic resistance selection signals DYNODT30, DYNODT60, and DYNODT120 as "1" in response to the dynamic ODT enable signal DYN_ODTEN, and activates the ODT check signal /CHK_ODT during the ODT test mode operation.

The normal resistance code generator 24-1 is configured to output the normal resistance code signals MRS_ODT30, MRS_ODT60, and MRS_ODT120 in response to the normal resistance selection signals NORODT30, NORODT60, and NORODT120. For example, when the normal resistance selection signal NORODT30 is "1", all the normal resistance code signals MRS_ODT30, MRS_ODT60, and MRS_ODT120 are output as "1", when the normal resistance selection signal NORODT60 is "1", the normal resistance code signals MRS_ODT60 and MRS_ODT120 are output as "1", and when the normal resistance selection signal NORODT120 is "1", the normal resistance code signal MRS_ODT120 is output as "1". The dynamic resistance code generator 24-2 is configured to operate similarly to that of the normal resistance code generator 24-1. That is, in this embodiment, when a resistance selection signal is input as a "1" the corresponding resistance code signal and the resistance code signals for higher resistances are output as a "1" while the resistance code signals for other resistances are output as a "0".

The normal resistance code signals MRS_ODT30, MRS_ODT60, and MRS_ODT120 and dynamic resistance code signals DYN_ODT30, DYN_ODT60, and DYN_ODT120 are output as the ODT control signals Rt_C. The ODT control signals Rt_C can indicate termination resistance used in the semiconductor memory device 110 during operations such as the normal ODT mode or the dynamic ODT mode, or the like. Moreover, as described above, the ODT control signals Rt_C can indicate a termination resistance for such modes. For example, when the normal resistance code signal MRS_ODT120 is "1", the semiconductor memory device can be configured to operate in the normal ODT mode with a termination resistance of 120 Ω.

Figure 3:
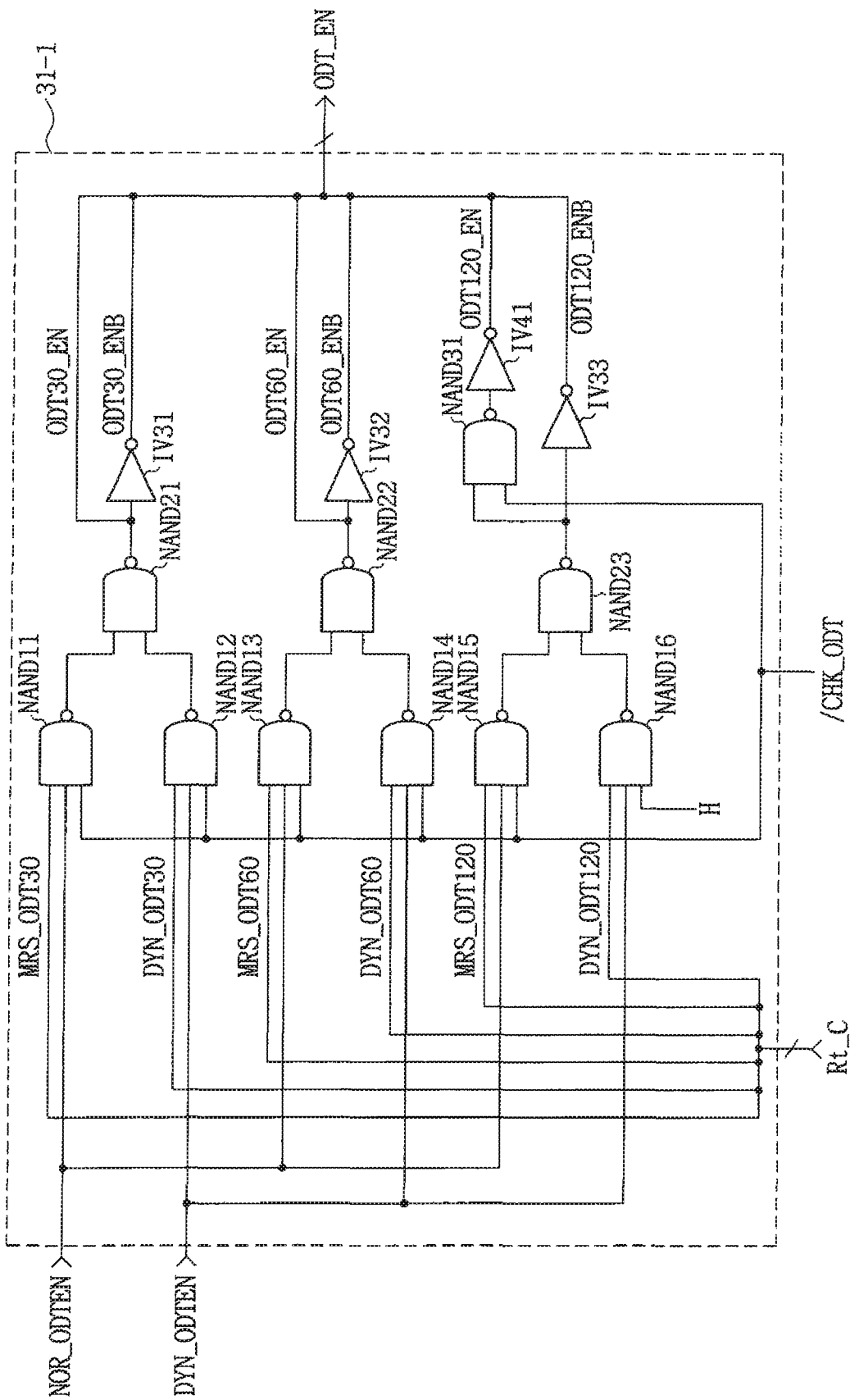
FIG. 3 is a schematic diagram illustrating an example of a drive signal generator of the semiconductor memory device of FIG. 1.

FIG. 3 is a schematic diagram illustrating an example of a drive signal generator of the semiconductor memory device of FIG. 1. In particular, an example of the drive signal generator 31-1 of FIG. 1 is given. However, as will be described in further detail below, the other drive signals generators 31 such as drive signal generator 31-2, 31-3, or the like can be configured differently.

The drive signal generator 31-1 includes NAND gates NAND11~NAND16, NAND21~NAND23, and NAND31 and inverters IV31 and IV32. The various NAND gates and inverters form a logic circuit that can combine together the normal ODT enable signal NOR_ODTEN, the dynamic ODT enable signal DYN_ODTEN, the ODT control signals Rt_C, and the ODT check signal/CHK_ODT.

In an embodiment, the drive signal generator 31 can be configured to mask all but one of the ODT control signals Rt_C in a test mode. In another mode, the drive signal generator 31 can be configured to provide one or more of the ODT control signals appropriate for the particular mode.

For example, in the drive signal generator 31-1 shown in FIG. 3, a high-level signal is input to the NAND gate NAND16 among the NAND gates NAND11~NAND16, and an ODT check signal/CHK_ODT is input to the other NAND gates NAND11~NAND15. The ODT check signal/CHK_ODT is also input to the NAND gate NAND31. The normal ODT enable signal NOR_ODTEN and the normal resistance selection signals MRS_ODT30, MRS_ODT60, and MRS_ODT120 are input to the NAND gates NAND11, NAND13, and NAND15, respectively. The dynamic ODT enable signal DYN_ODTEN and the dynamic resistance selection signals DYN_ODT30, DYN_ODT60, and DYN_ODT120 are input to the NAND gates NAND12, NAND14, and NAND16, respectively.

When the high-level ODT check signal/CHK_ODT is input, the drive signal generator 31-1 outputs the ODT drive signals ODT_EN in response to the normal ODT enable signal NOR_ODTEN and the dynamic ODT enable signal DYN_ODTEN output from the command decoder 10 and the ODT control signals Rt_C output from the resistance code generator 24. That is, the high level of the ODT check signal/CHK_ODT causes the NAND gates NAND11~NAND15 to pass the corresponding resistance selection signal. Since NAND gate NAND16 includes a high level as an input instead of the ODT check signal/CHK_ODT, the resistance selection signal received by the NAND gate NAND16 is also passed.

For example, in this embodiment, the ODT drive signals ODT_EN include pull-down signals ODT30_EN, ODT60_EN and ODT120_EN and pull-up signals ODT30_ENB, ODT60_ENB, and ODT120_ENB. When the normal ODT enable signal NOR_ODTEN is activated to a high level, the drive signal generator 31-1 outputs the normal resistance code signals MRS_ODT30, MRS_ODT60, and MRS_ODT120 as the pull-down signals ODT30_EN, ODT60_EN, and ODT120_EN, and outputs signals generated by inverting the normal resistance code signals MRS_ODT30, MRS_ODT60, and MRS_ODT120 as the pull-up signals ODT30_ENB, ODT60_ENB, and ODT120_ENB. Similarly, when the dynamic ODT enable signal DYN_ODTEN is activated to the high level, the drive signal generator 31-1 outputs the dynamic resistance code signals DYN_ODT30, DYN_ODT60, and DYN_ODT120 as the pull-down signals ODT30_EN, ODT60_EN, and ODT120_EN, and outputs signals generated by inverting the dynamic resistance code signals DYN_ODT30, DYN_ODT60, and DYN_ODT120 as the pull-up signals ODT30_ENB, ODT60_ENB, and ODT120_ENB.

In contrast, when the low-level ODT check signal/CHK_ODT is input, outputs of NAND gates NAND11~NAND15 all become a high level regardless of the other inputs. Thus, those inputs are masked. However, the inputs to NAND gate NAND16 are passed as before since NAND gate NAND16 has a high level input instead of the ODT check signal/CHK_ODT. In addition, in this embodiment, the NAND gate 31 is configured to receive the ODT check signal/CHK_ODT as well. As a result, the pull-down signal ODT120_EN is deactivated.

Accordingly, the drive signal generator 31-1 activates one pull-up signal ODT120_ENB of the ODT drive signals ODT_EN to the low level only when the dynamic ODT enable signal DYN_ODTEN and the dynamic resistance code signal DYN_ODT120 of the ODT control signals Rt_C have the high level. That is, in the ODT drive signals ODT_EN from the drive signal generator 31-1, only a pull-up signal corresponding to a state of one of the ODT control signals Rt_C is output while the other ODT drive signals ODT_EN are deactivated.

Figure 6:
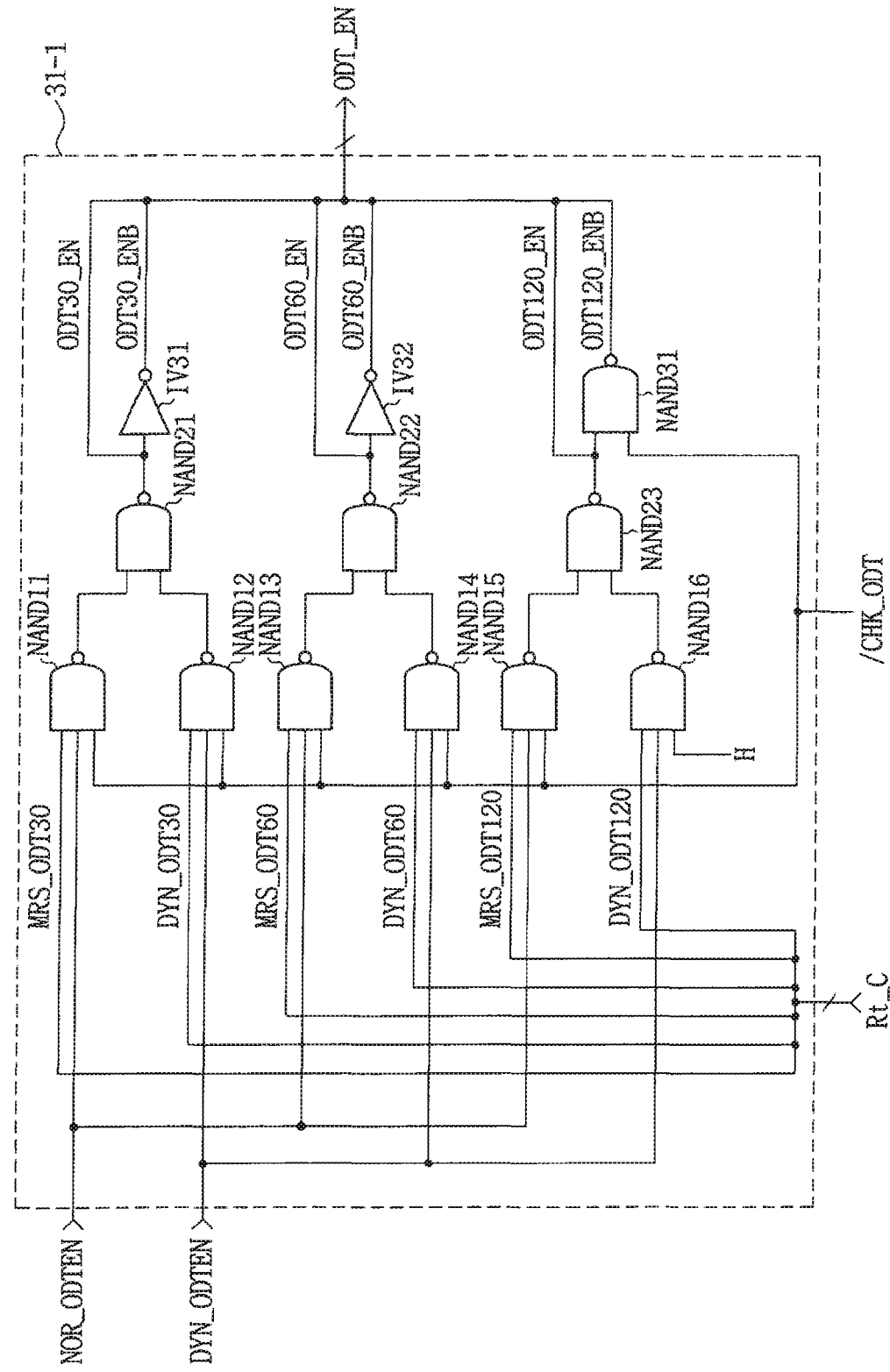
FIG. 6 is a schematic diagram illustrating another example of the drive signal generator of the semiconductor memory device of FIG. 1.

As described above, drive signal generator 31-1 is an example of the drive signal generators 31; however, the other drive signal generators 31 can be different. For example, the drive signal generator 31-2 can be the same as shown in FIG. 6, except that the high-level signal is applied to the NAND gate NAND15 and the ODT check signal/CHK_ODT is input to the NAND gates NAND11~NAND14 and NAND16. Similarly, the drive signal generator 31-3 may be configured to apply the high level signal to the NAND gate NAND14. Thus, the high level signal can be applied to any of the NAND gates NAND11~NAND16 for the corresponding ODT control signal. Thus, each drive signal generator 31 can be configured to generate the ODT drive signals ODT_EN not only differently, but corresponding to a particular signal of the ODT control signals Rt_C.

Although a particular configuration of NAND gates and inverters have been given, other logic schemes can be used. Moreover, although ODT drive signals ODT_EN have been described as having pull-up and pull down signals, in an embodiment, only a pull-up signal or a pull down signal, or the like may be generated. For example, an ODT drive unit 40 configuration may only use a pull-up signal.

Figure 4:
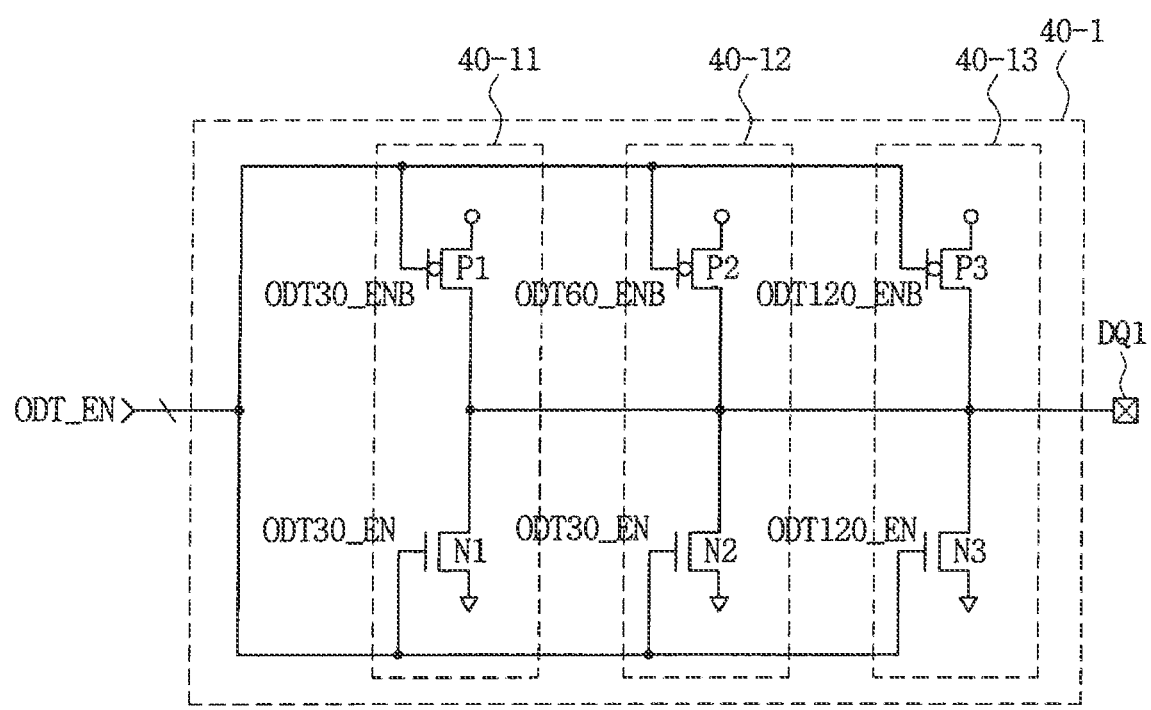
FIG. 4 is a schematic diagram illustrating an example of an ODT drive unit of the semiconductor memory device of FIG. 1.

FIG. 4 is a schematic diagram illustrating an example of an ODT drive unit of the semiconductor memory device of FIG. 1. The ODT drive unit 40-1 may include ODT drivers 40-11, 40-12, and 40-13 configured with a p-channel metal oxide semiconductor (PMOS) transistor as a pull-up transistor and an n-channel metal oxide semiconductor (NMOS) transistor as a pull-down transistor.

During the normal mode operation, the ODT drivers 40-11, 40-12, and 40-13 are configured to terminate a terminal DQ1 with a termination value in response to the ODT drive signals ODT_EN. That is, the ODT drive unit 40-1 is configured to terminate the terminal DQ1 with the termination voltage and resistance in response to the ODT drive signals ODT_EN generated by the corresponding drive signal generator 31 during the normal mode operation.

During the ODT test mode operation, the ODT drive unit 40-1 is configured to output an ODT output drive signal by selecting one ODT driver in response to the ODT drive signal ODT_EN. For example, as described above with respect to FIG. 3, during the ODT test mode operation, the drive signal generator 31-1 activates the pull-up signal ODT120_ENB to the low level when the dynamic resistance code signal DYN_ODT120 of the ODT control signals Rt_C is "1". Accordingly, the ODT drive unit 40-13 is selected and the ODT drive unit 40-1 outputs a high-level ODT output drive signal. When the dynamic resistance code signal DYN_ODT120 is "0", the drive signal generator 31-1 deactivates all the ODT drive signals ODT_EN. Accordingly, the ODT drive unit 40-1 outputs a low-level ODT output drive signal.

The other ODT drive units 40 can be configured similarly. However, as the drive signal generators 31 corresponding to the ODT drive units can output different ODT drive signals ODT_EN, a different ODT driver can be activated according to a different resistance code. As a result, different terminals DQ can be pulled to different states according to corresponding ODT control signals Rt_C.

As described above, the ODT drive unit can be configured as pull-up, pull-down, a combination of pull-up and pull-down, or the like. Accordingly, in an embodiment, the ODT drivers 40-11, 40-12, and 40-13 can be configured with only pull-up or only pull-down transistors.

Figure 5:
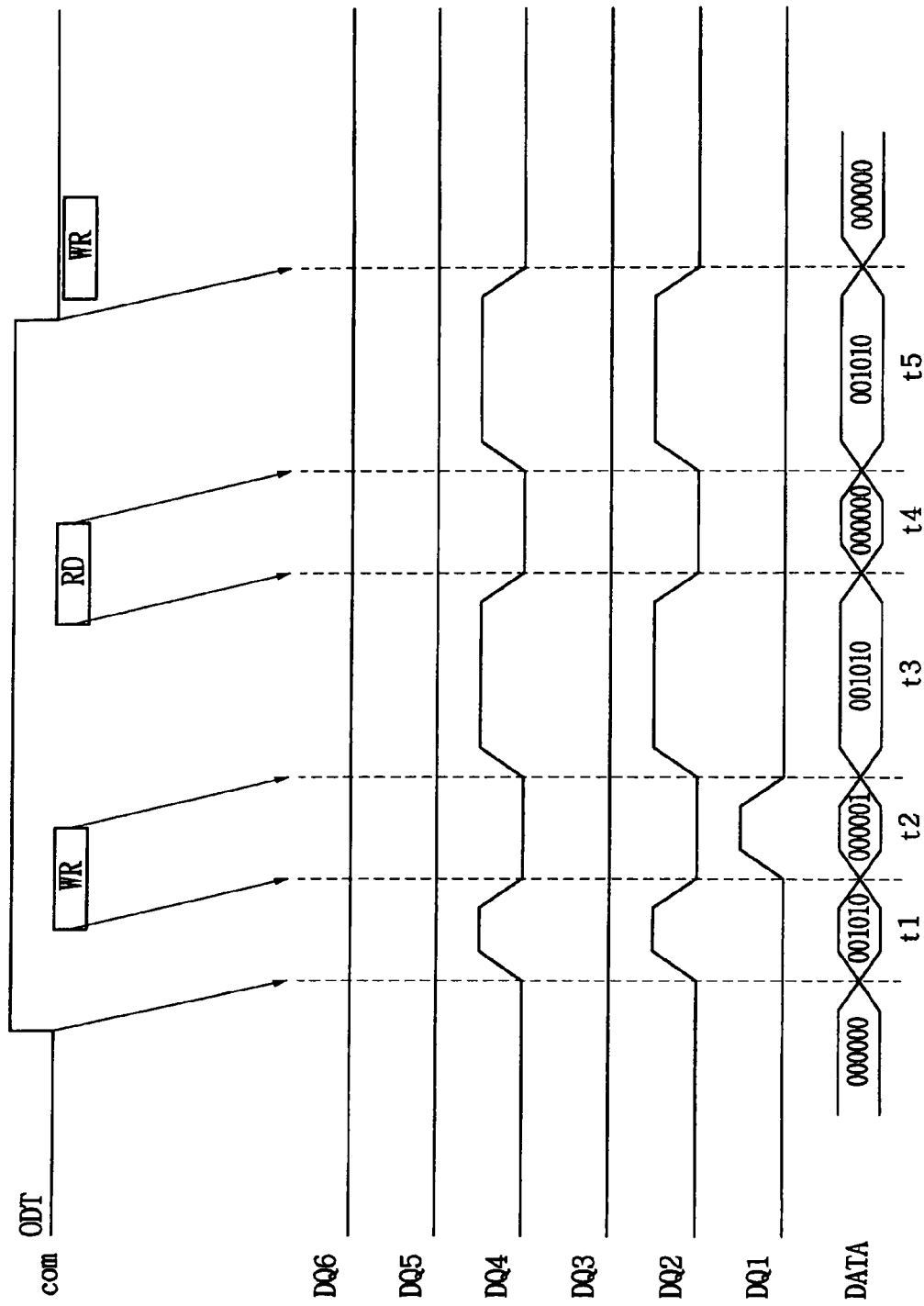
FIG. 5 is a timing diagram illustrating an example of an ODT test mode operation according to an embodiment.

FIG. 5 is a timing diagram illustrating an example of an ODT test mode operation according to an embodiment. In this embodiment, the semiconductor memory device 110 has been set such that a termination resistance of 60 ohms is used in the normal ODT mode and a termination resistance of 120 ohms is used in the dynamic ODT mode. The drive signal generator 31-1 is configured to output the pull-up signal ODT120_ENB at the low level when the dynamic resistance code signal DYN_ODT120 of the resistance code signals is "1". The drive signal generator 31-2 is configured to output the pull-up signal ODT120_ENB at the low level when the normal resistance code signal MRS_ODT120 of the resistance code signals is "1". The drive signal generator 31-3 is configured to output the pull-up signal ODT60_ENB at the low level when the dynamic resistance code signal DYN_ODT60 of the resistance code signals is "1". The drive signal generator 31-4 is configured to output the pull-up signal ODT60_ENB at the low level when the normal resistance code signal MRS_ODT60 of the resistance code signals is "1". The drive signal generator 31-5 is configured to output the pull-up signal ODT30_ENB at the low level when the dynamic resistance code signal DYN_ODT30 of the resistance code signals is "1". The drive signal generator 31-6 is configured to output the pull-up signal ODT30_ENB at the low level when the normal resistance code signal MRS_ODT30 of the resistance code signals is "1". In FIG. 5, ODT represents a waveform of an ODT signal output from a memory controller, and DQ1~DQ6 represent a waveform when voltages of the pads are measured by a test device.

When the ODT signal is activated to the high level in interval t1, the command decoder 10 activates the normal ODT enable signal NOR_ODTEN, the selector 23 outputs the normal resistance selection signal NORODT60 as "1", and the resistance code generator 24 outputs the normal resistance code signals MRS_ODT60 and MRS_ODT120 as "1". Accordingly, the drive signal generator 31-2 activates only the pull-signal ODT120_ENB to the low level and the drive signal generator 31-4 activates only the pull-up signal ODT60_ENB to the low level. All the other drive signal generators 31-1, 31-3, 31-5, and 31-6 deactivate the ODT drive signals. Accordingly, a PMOS transistor P3 of the ODT driver 40-2 is turned on and all the other transistors are turned off. A PMOS transistor P2 of the ODT driver 40-4 is turned on and all the other transistors are turned off. All transistors of the ODT drive units 40-1, 40-3, 40-5, and 40-6 are turned off. Therefore, data measured by the test device in interval t1 becomes (001010).

When a write command is applied in interval t2, the command decoder 10 activates the dynamic enable signal DYN_ODTEN, the selector 23 outputs the dynamic resistance selection signal DYNODT120 as "1", and the resistance code generator 24 outputs the dynamic resistance code signal DYN_ODT120 as "1". Accordingly, the drive signal generator 31-1 activates only the pull-up signal ODT120_ENB to the low level and the other drive signal generators 31-2~31-6 deactivate all the ODT drive signals. Accordingly, a PMOS transistor P3 of the ODT drive unit 40-1 is turned on and all the other transistors are turned off. All transistors of the ODT drivers 40-2~40-6 are turned off. Therefore, data measured by the test device in interval t2 becomes (000001).

In interval t3, like interval t1, data measured by the test device becomes (001010).

Since the command decoder 10 deactivates both the normal ODT enable signal NOR_ODTEN and the dynamic ODT enable signal DYN_ODTEN when a read command is applied in interval t4, the drive signal generators 31-1~31-6 deactivate all the ODT drive signals. All transistors of the ODT drive units 40-1, 40-2, 40-3, etc. are turned off. Accordingly, data measured by the test device becomes (000000).

In interval t5, like intervals t1 and t3, data measured by the test device becomes (001010).

Assuming that the semiconductor memory device inputs a command in the same pattern as shown in FIG. 5 during the ODT test mode operation, it may be determined that the ODT circuit operates normally when data measured by the test device in intervals t1~t5 become (001010), (000001), (001010), (000000), and (001010) as these values can represent the normal ODT state, the dynamic ODT state, and the off ODT state.

FIG. 6 is a schematic diagram illustrating another example of the drive signal generator of the semiconductor memory device of FIG. 1. The drive signal generator 31-1 includes NAND gates NAND11~NAND 16, NAND21~NAND23, and NAND31, and inverters IV31 and IV32.

When the dynamic resistance code signal DYN_ODT120 is "1", the drive signal generator 31-1 shown in FIG. 6 performs the same operation as the drive signal generator 31-1 shown in FIG. 3, except that the pull-down signal ODT120_EN is activated to the high level when the input dynamic resistance code signal DYN_ODT120 is "1". That is, when the drive signal generators 31-1~31-6 are configured as shown in FIG. 6, data and voltages of terminals DQ1~DQ6 shown in FIG. 5 are inverted.

As described above, in an embodiment, the control signal generator 21 includes the selector 23 configured with a mode register set, or the like, and the resistance code generator 24 has been described, but the control signal generator 21 may include only the selector configured with the mode register set, etc. In such an embodiment, the control signal generator 21 may output the ODT control signals in the same form as the above-described resistance selection signals and the ODT drive unit may include ODT drivers separately configured according to termination resistances. The selector may be configured to output the above-described normal and dynamic resistance code signals in response to the normal ODT enable signal and the dynamic ODT enable signal.

While particular embodiments have been disclosed herein, it should be understood that other variations may be possible. Such variations are not to be regarded as a departure from the spirit and scope of following claims, and all such modifications as would be obvious to one skilled in the art are intended to be included within the scope of the following claims.

What is claimed is:

1. An on-die termination (ODT) circuit, comprising:
a plurality of drive signal generators, each drive signal generator configured to generate corresponding ODT drive signals; and
a plurality of ODT drive units, each ODT drive unit configured to terminate a corresponding terminal with a termination resistance in response to the ODT drive signals of a corresponding drive signal generator,
wherein the drive signal generators are configured to supply the ODT drive signals to the ODT drive units to output a plurality of ODT control signals through the terminals in a test mode, and
wherein each drive signal generator is configured to receive a normal ODT enable signal and a dynamic ODT enable signal, to output a plurality of normal resistance code signals as the ODT drive signals when the normal ODT enable signal is activated, and to output a plurality of dynamic resistance code signals as the ODT drive signals when the dynamic ODT enable signal is activated.

2. The ODT circuit of claim 1, wherein each drive signal generators is configured to receive an ODT check signal and activate one of the drive signals in response to the ODT check signal in the test mode such that the normal resistance code signals and the dynamic resistance code signals are output thought the terminals.

3. The ODT circuit of claim 1, wherein each of the drive signal generators comprises:
a plurality of first NAND gates configured to receive the normal ODT enable signal and the normal resistance code signals; and
a plurality of second NAND gates configured to receive the dynamic ODT enable signal and the dynamic resistance code signals;
wherein:
only one NAND gate of the first and second NAND gates is configured to receive a high-level signal and the remaining NAND gates of the first and second NAND gates are configured to receive the ODT check signal; and
the drive signal generator is configured to generate the ODT drive signals in response to the first NAND gates and the second NAND gates.

4. A semiconductor memory device comprising:
a command decoder configured to output a normal ODT enable signal and a dynamic ODT enable signal;
a control signal generator configured to output a plurality of ODT control signals in response to the normal ODT enable signal and the dynamic ODT enable signal, and activate an ODT check signal during an ODT test mode operation;
a plurality of drive signal generators, each drive signal generator configured to generate a corresponding plurality of ODT drive signals in response to the ODT control signals, the normal ODT enable signal, the dynamic ODT enable signal, and the ODT check signal; and
a plurality of ODT drive units, each ODT drive unit configured to terminate a corresponding terminal with a termination resistance in response to the ODT drive signals of a corresponding drive signal generator;
wherein the drive signal generators are configured to supply the ODT drive signals to the ODT drive units to output the ODT control signals through the terminals in a test mode.

5. The semiconductor memory device of claim 4, wherein the control signal generator comprises a mode register set configured to output a plurality of normal resistance code signals and a plurality of dynamic resistance code signals as the plurality of ODT control signals in response to the normal ODT enable signal and the dynamic ODT enable signal.

6. The semiconductor memory device of claim 4, wherein the control signal generator comprises:
a mode register set configured to output a plurality of normal resistance selection signals and a plurality of dynamic resistance selection signals in response to the normal ODT enable signal and the dynamic ODT enable signal; and
a resistance code generator configured to output a plurality of normal resistance code signals and a plurality of dynamic resistance code signals as the plurality of ODT control signals in response to the normal resistance selection signals and the dynamic resistance selection signals.

7. The semiconductor memory device of claim 6, wherein each drive signal generator is responsive to the normal resistance code signals and the dynamic resistance code signals.

8. The semiconductor memory device of claim 6, wherein each drive signal generator comprises a logic circuit configured to mask the ODT control signals to generate the corresponding ODT drive signals.

9. The semiconductor memory device of claim 8, wherein for each drive signal generator the logic circuit is configured to mask the ODT control signals such that only one of the ODT drive signals is activated in response to a corresponding one of the ODT control signals.

10. The semiconductor memory device of claim 4, wherein for each ODT drive unit:
the ODT drive unit comprises a plurality of ODT drivers, each ODT driver responsive to two ODT drive signals from the corresponding drive signal generator; and
in the test mode, the corresponding drive signal generator is configured to activate only one of the two ODT drive signals for one of the ODT drivers.

11. The semiconductor memory device of claim 8, wherein for each ODT drive unit:
the ODT drive unit comprises a plurality of ODT drivers, each ODT driver responsive to two ODT drive signals from the corresponding drive signal generator; and
in the test mode, the corresponding drive signal generator is configured to drive one of the ODT drivers to pull the corresponding terminal to output a corresponding ODT control signal.

* * * * *